(12) United States Patent
Kanno et al.

(10) Patent No.: US 7,755,148 B2
(45) Date of Patent: Jul. 13, 2010

(54) SEMICONDUCTOR INTEGRATED CIRCUIT

(75) Inventors: Yusuke Kanno, Kodaira (JP); Kenichi Yoshizumi, Fukuoka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/429,024

(22) Filed: Apr. 23, 2009

(65) Prior Publication Data
US 2009/0200617 A1 Aug. 13, 2009

Related U.S. Application Data

(62) Division of application No. 11/777,276, filed on Jul. 12, 2007, now Pat. No. 7,569,899.

(30) Foreign Application Priority Data

Aug. 31, 2006 (JP) ............... 2006-236119

(51) Int. Cl.
*H01L 27/00* (2006.01)
(52) U.S. Cl. .............. 257/393; 257/391; 257/392; 257/499; 257/E27.001
(58) Field of Classification Search ........ 257/393, 257/391, 392, 499, E27.001
See application file for complete search history.

(56) References Cited

U.S. PATENT DOCUMENTS 5,408,144 A 4/1995 Sakata et al.

7,145,383 B2 * 12/2006 Mizuno et al. .......... 327/546
2004/0151050 A1 8/2004 Ooishi
2008/0283986 A1 * 11/2008 Hirata .................... 257/678

FOREIGN PATENT DOCUMENTS

JP 06-203558 A 7/1994
JP 2004-235470 A 8/2004

OTHER PUBLICATIONS

Kanno et al., "Hierarchical Power Distribution with 20 Power Domains in 90-nm Low-Power Multi-CPU Processor", ISSCC Dig. Tech. Papers, pp. 540-541, 671, Feb. 2006.

* cited by examiner

*Primary Examiner*—Victor A Mandala
(74) *Attorney, Agent, or Firm*—Miles & Stockbridge P.C.

(57) ABSTRACT

Logic LSI includes first power domains PD1 to PD4, thick-film power switches SW1 to SW4, and power switch controllers PSWC1 to PSWC4. The thick-film power switches are formed by thick-film power transistors manufactured in a process common to external input/output circuits I/O. The first power domains include second power domains SPD11 to SPD42 including logic blocks, control circuit blocks SCB1 to SCB4, and thin-film power switches SWN11 to SWN42 that are connected to the thick-film power switches via virtual ground lines VSSM1 to VSSM4, and formed by thin-film power transistors manufactured in a process common to the logic blocks. In this way, power switches having different thickness of gate insulating films from one another are vertically stacked so as to be in a hierarchical structure, and each power switch is individually controlled by a power switch controller and a control circuit block correspondingly to each mode.

4 Claims, 11 Drawing Sheets

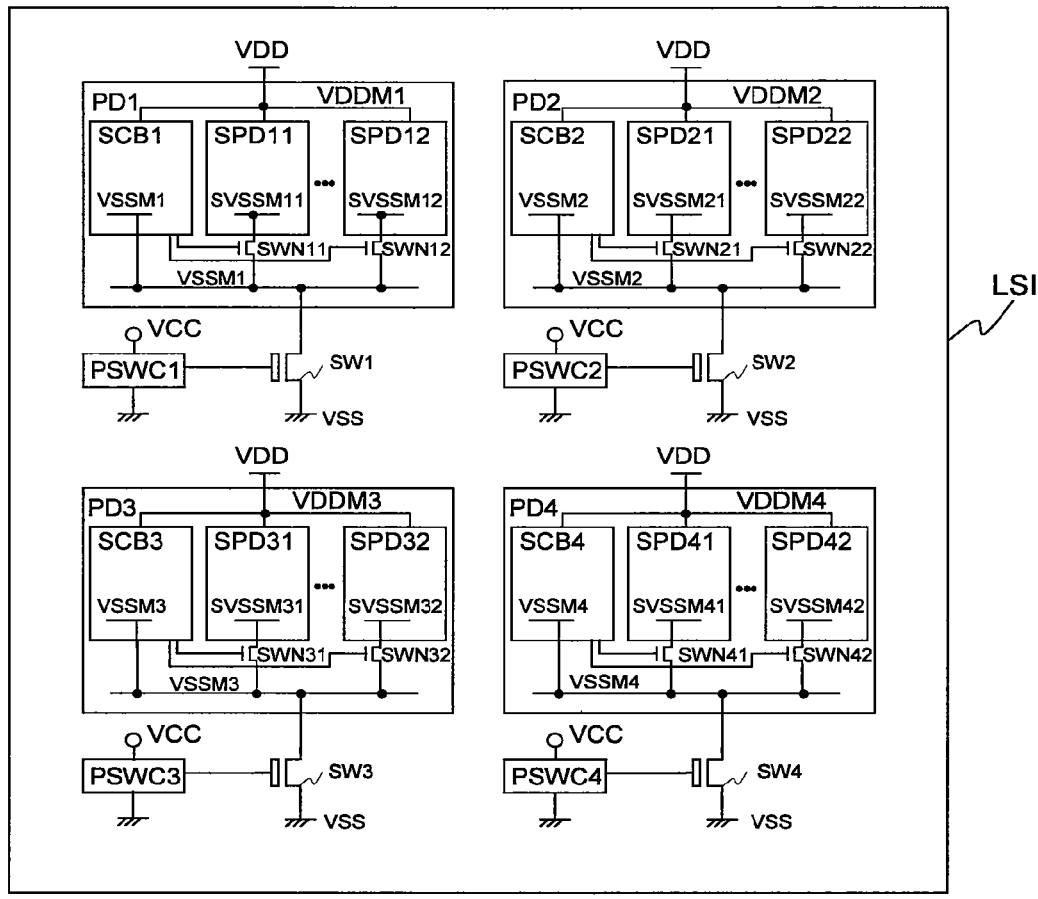
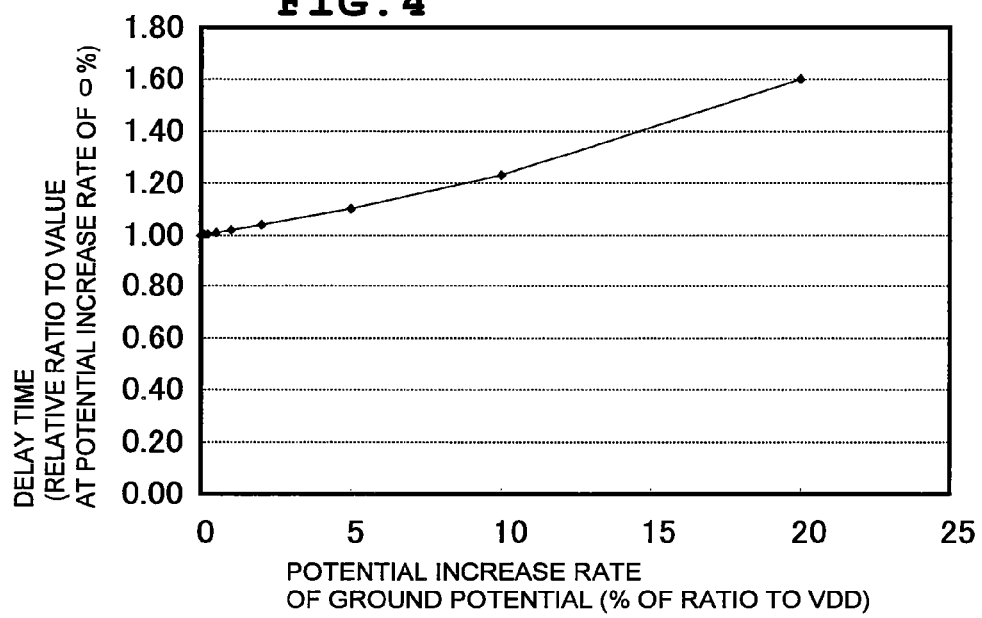

FIG. 3
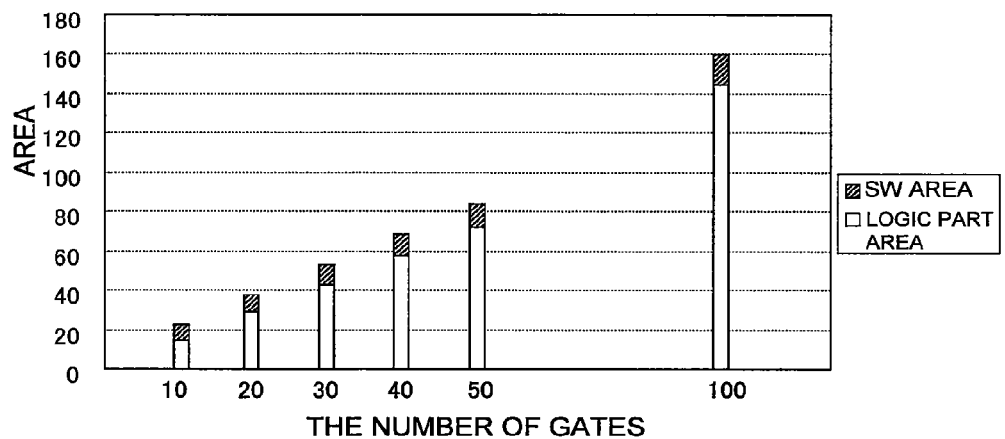
(a)
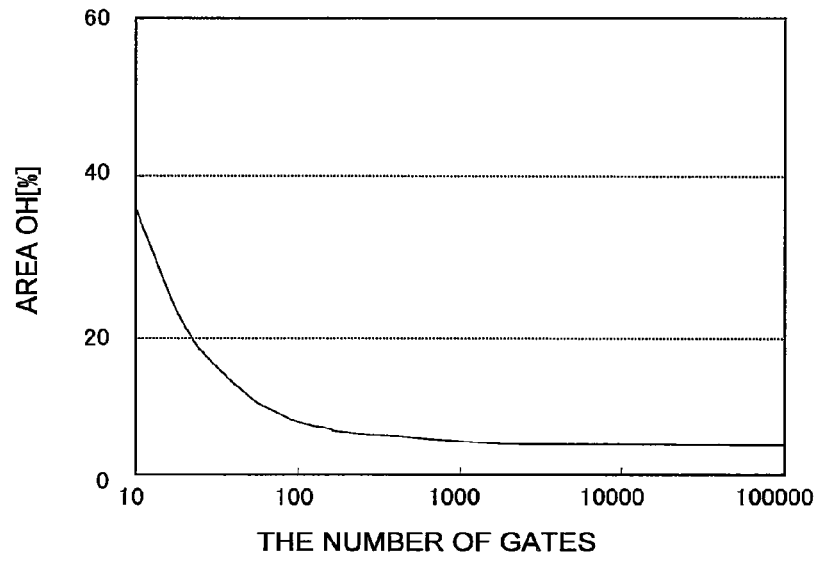
(b)

SEMICONDUCTOR INTEGRATED CIRCUIT

CROSS-REFERENCE TO RELATED APPLICATION

This application is a division of application Ser. No. 11/777,276 filed Jul. 12, 2007 (now U.S. Pat. No. 7,569,899). The present application also claims priority from Japanese application JP 2006-236119 filed on Aug. 31, 2006, the content of which is hereby incorporated by reference into this application.

BACKGROUND OF THE INVENTION

1. Field of the Invention

The present invention relates to a semiconductor integrated circuit, and particularly relates to a technique useful for use in system LSI for mobile device, microprocessor and the like.

2. Description of Related Art

The number of circuit blocks integrated in one LSI is remarkably increased due to progress in fine processing technology of semiconductors, and therefore usually unimaginable, complicated information processing can be achieved in one chip. Such LSI is called SoC (System on a Chip) and used for a system for mobile device and the like. However, a leakage current in a single transistor tends to increase due to progress in fine processing technology of semiconductors. As a result, the total leakage current in SoC is becoming extremely increased.

To such SoC in which a large number of circuit blocks are integrated in one chip, demand on further high-speed operation of the circuit blocks is becoming increased with improvement in functions which is required for mobile devices and the like. For example, even if a transistor that can perform high-speed operation such as a transistor having a low threshold voltage or a transistor having a small thickness of a gate insulating film is used to achieve such high-speed operation, increase in leakage current is inevitable. Therefore, it is an important issue for SoC that increase in leakage current is prevented, in addition, high-speed operation is achieved.

In SoC used for a system for mobile device or the like, the integrated circuit blocks can be exclusively used, and currently, only a necessary circuit is typically operated correspondingly to a scene to be used (hereinafter, simply called mode) or the like. That is, in SoC, an operation period can be definitely distinguished from a non-operation period in the integrated circuit blocks. When such technology is used, an idea is given, that is, circuits are configured by high-speed devices that can be operated at high speed, and power shutdown is closely performed during non-operation period so that the circuits are operated at extremely high speed in the operation period, and the leakage current is reduced in the non-operation period.

JP-A-2004-235470 discloses a control method of power shutdown that can extremely reduce the leakage current by performing control using a switch having a large thickness of a gate insulating layer of transistors. However, since such a switch having the large thickness of the gate insulating layer takes large area, when a large number of power shutdown regions are provided within a chip, areal overhead costs are extremely increased, and therefore the switch is becoming hard to be mounted. On the other hand, when power is shut down using a switch having a small thickness of the gate insulating layer, while increase in area of the power switch can be reduced, an effect of reducing the leakage current cannot be sufficiently obtained compared with a case that power is shut down using the transistor having the large thickness of the gate insulating layer.

JP-A-6-203558 discloses a technique that power shutdown of LSI is hierarchically carried out, thereby a period is reduced, in which a voltage level of a circuit being subjected to power shutdown is unstable, so that time for subsequently returning the circuit to an original state by voltage application is made faster.

In a non-patent document 1, Y. Kanno, et al., "Hierarchical Power Distribution with 20 Power Domains in 90-nm Low-Power Multi-CPU Processor," ISSCC Dig. Tech. Papers, PP. 540-541, 671, February, 2006; SoC is disclosed, which has a plurality of power domains provided within a chip, power switches (PSW) for the power domains, and SRAM macros arranged in the power domains. Here, the power domain refers to a region where power shutdown can be performed using a power switch, which corresponds to the above power shutdown region. The power switch includes n-channel MOS transistors, each transistor having a large thickness of a gate oxide film and a high threshold voltage, for which transistors used in an external input/output circuit (I/O) are used. In the SRAM macros, special power switches are provided for reducing the leakage current.

SUMMARY OF THE INVENTION

In consideration of layout or area of the power switches, and furthermore thickness of the gate insulating film, the inventor made investigation on a unit that enables high-speed operation of circuit blocks, and performs close power shutdown control while reducing the leakage current. In JP-A-6-203558, while power shutdown of LSI is hierarchically carried out, no description is made on thickness of the gate insulating film of the transistor. Regarding the layout of the power switches, vertical stacking or series connection of the power switches has not been typically used. This is because on-resistances of transistors configuring the power switches are connected in series, causing reduction in on-currents, which may concernedly affect degradation in performance (reduction in speed). Therefore, for example, vertically-stacked power switches are provided in a circuit block consuming a large current only in the case that speed reduction is allowed. However, the inventor made detailed investigation on an effect of the power switches on a circuit block that operates at high speed, as a result, found that even if power shutdown was performed with the power switches being vertically stacked, only slight reduction in speed was given by considering a circuit scale of the circuit block or area of the power switches (hereinafter, called SW area) compared with a case that the power switches were not vertically stacked. Here, the circuit scale corresponds to the number of gates in a circuit block. Moreover, area of a circuit block corresponding to the number of gates is called logic part area. In this specification, a ratio (%) of the SW area to the total area of the logic part area and the SW area is called area overhead (hereinafter, called area OH).

While the non-patent document 1 discloses a configuration of stacking the power switches that use gate oxide films having different thickness from one another, it does not consider area OH based on area of a memory cell array in the SRAM macro, and area of a special power switch corresponding to the memory cell array to reduce the leakage current.

An object of an embodiment of the invention is to provide a semiconductor integrated circuit that enables high-speed operation of a circuit block, and can perform close power shutdown control while reducing the leakage current.

The above and other objects and novel features of an embodiment of the invention will be clarified from description of the specification and accompanying drawings.

Summaries of typical inventions disclosed in the application are briefly described as follows.

(1) A semiconductor integrated circuit (LSI: FIG. 2) according to an embodiment of the invention includes a plurality of first power switches (SW1 to SW4), first ground lines (VSSM1 to VSSM4), a plurality of second power switches (SWN11 to SWN42), second ground lines (SVSSM11 to SVSSM42), first power lines (VDDM1 to VDDM4), a plurality of circuit blocks (IP: FIG. 1), first control circuits (PSWC1 to PSWC4), and second control circuits (SCB1 to SCB4). The first power switches receive a ground voltage (VSS). The first ground lines are connected to the first power switches. The second power switches are connected to the first ground lines, and have gate insulating films being thinner than gate insulating films of the first power switches. The second ground lines are connected to the plurality of second power switches respectively. The first power lines receive a power voltage. The circuit blocks are connected to the second ground lines and the first power lines respectively. The first control circuits control the first power switches individually. The second control circuits control the second power switches individually.

From the above, the first power switches are connected with the plurality of second power switches via the first ground lines, and the first power switches and the plurality of second power switches are arranged in a vertically stacked manner so as to be in a hierarchical structure respectively. Since the first power switches have the gate insulating films being thicker than the gate insulating films of the second power switches, each of them has a high threshold voltage, and therefore can reduce a leakage current. Since the first control circuits individually control the first power switches respectively, for example, in a mode that all circuit blocks are not used, which are supplied with currents via a plurality of second power switches connected to a particular first power switch, when the particular first power switch is allowed to be off, the circuit blocks can be collectively subjected to power shutdown. In particular, when a semiconductor integrated circuit as a whole is in a standby state, the first control circuits allow all the plurality of first power switches to be off, so that the leakage current can be extremely reduced. Since the second power switches have the gate insulating films being thinner than the gate insulating films of the first power switches, each of them has a low threshold voltage, and therefore can perform high-speed operation. Since the second control circuits individually control the second power switches respectively, for example, in a mode that a circuit block is not used, which is supplied with a current via a particular second power switch, when the particular second power switch is allowed to be off, power shutdown of the particular circuit block can be performed at high speed. In a word, the first power switches and the second power switches, in which the gate insulating films are different in thickness from each other, are in the hierarchical structure, and they are individually controlled by the first control circuits and the second control circuits, thereby high-speed operation of the circuit blocks is enabled, and close power shutdown control can be performed correspondingly to each kind of mode while reducing the leakage current.

As a specific mode of the embodiment of the invention, the semiconductor integrated circuit further has external input/output circuits (I/O) plurally arranged on a semiconductor substrate (SUB: FIG. 6). The first power switches are formed by the same transistors as transistors arranged in regions of the external input/output circuits. The second power switches are formed by the same transistors as transistors arranged in regions of the circuit blocks. From the above, since each of the first power switches has a thick gate insulating film, and a high threshold voltage, it can reduce the leakage current. Since each of the second power switches has a thin gate insulating film, and a low threshold voltage, it can perform high-speed operation.

As a specific mode of the embodiment of the invention, the second ground lines are wired with being approximately uniformly conducted in the regions of the circuit blocks. The second power switches are dispersedly arranged on the second ground lines. From the above, the second power switches are dispersedly arranged in the regions of the circuit blocks, and the transistors having thin gate insulating films, which configure the respective, second power switches, are connected in parallel with the second ground lines. Therefore, in the case that predetermined processing is performed in a circuit block, when an activation ratio of a plurality of logic circuits included in the circuit block is assumed to be, for example, about 10%, all transistors connected in parallel with the second ground lines contribute to supply currents to the about 10% of logic circuits. Thus, an increase rate of SW area of the second power switches is reduced compared with an increase rate of a circuit scale of the circuit block, that is, an increase rate of logic part area corresponding to the number of gates of transistors configuring the logic circuits. In a word, considering difference between the increase rate of SW area and the increase rate of logic part area, when the number of gates is somewhat increased, area OH can be decreased to less than a predetermined value, for example, about 10%. As a result, integration of the semiconductor integrated circuit can be increased.

(2) A semiconductor integrated circuit (LSI: FIG. 8) according to another embodiment of the invention includes a plurality of first power switches (SW1 to SW4), first ground lines (VSSM1 to VSSM4), a plurality of second power switches (SWP11 to SWP42), first power lines (SVDDM11 to SVDDM42), a plurality of circuit blocks (IP), first control circuits (PSWC1 to PSWC4), and second control circuits (SCB1 to SCB4). The first power switches receive a ground voltage (VSS), and are formed by n-channel MOS transistors. The first ground lines are connected to the first power switches. The second power switches receive a power voltage (VDD), and are formed by p-channel MOS transistors in which the gate insulating films are thinner than gate insulating films of the first power switches. The first power lines are connected to the plurality of second power switches respectively. The circuit blocks are connected to the first ground lines and the first power lines respectively. The first control circuits control the first power switches individually. The second control circuits control the second power switches individually.

From the above, the first power switches, which are formed by the n-channel MOS transistors having thick gate insulating films, and can reduce the leakage current, and the second power switches, which are formed by the p-channel MOS transistors having thin gate insulating films, and can perform high-speed operation, are arranged in a vertically stacked manner so as to be in a hierarchical structure respectively, and furthermore, the power switches are individually controlled using the first control circuits and the second control circuits. Consequently, as in the semiconductor integrated circuit of the above (1), high-speed operation of the circuit blocks is enabled, and close power shutdown control can be performed correspondingly to each kind of mode while reducing the leakage current.

As a specific mode of the embodiment of the invention, the semiconductor integrated circuit further has third control circuits (RC1 to RC4) that are connected to gates of the second power switches, and perform control of allowing the second power switches to function as regulators. From the above, for example, while a voltage of a predetermined circuit block is lowered during standby to reduce the leakage current, an internal condition of the circuit block can be kept. Moreover, for example, a voltage is lowered during low-speed operation, so that power consumption can be reduced.

(3) A semiconductor integrated circuit (LSI: FIG. 9) according to still another embodiment of the invention includes a plurality of first power switches (SW1 to SW4), first ground lines (VSSM1 to VSSM4), a plurality of second power switches (SWN11 to SWN42), second ground lines (SVSSM11 to SVSSM42), a plurality of third power switches (SWP11 to SWP42), first power lines (SVDDM11 to SVDDM42), a plurality of circuit blocks (IP), first control circuits (PSWC1 to PSWC4), and second control circuits (SCB1 to SCB4). The first power switches receive a ground voltage (VSS), and are formed by n-channel MOS transistors. The first ground lines are connected to the first power switches. The second power switches are connected to the first ground lines, and are formed by n-channel MOS transistors in which the gate insulating films are thinner than gate insulating films of the first power switches. The second ground lines are connected to the plurality of second power switches respectively. The third power switches receive a power voltage (VDD), and are formed by p-channel MOS transistors in which the gate insulating films have the same thickness as thickness of the gate insulating films of the second power switches. The first power lines are connected to the plurality of third power switches respectively. The circuit blocks are connected to the second ground lines and the first power lines respectively. The first control circuits control the first power switches individually. The second control circuits control the second power switches and the third power switches individually.

From the above, the second power switches formed by the n-channel MOS transistors having the thin gate insulating films are provided at a ground side, and the third power switches formed by the p-channel MOS transistors having the thin gate insulating films are provided at a power side, and furthermore, the first power switches formed by the n-channel MOS transistors having the thick gate insulating films and the second power switches are made in a hierarchical structure respectively. According to this, while an increase rate of SW area corresponding to the number of gates in a circuit block is somewhat increased, since threshold voltages of the second power switches and the third power switches are apparently increased due to a substrate effect, the leakage current can be further reduced. Moreover, the first to third power switches are individually controlled using the first control circuits and the second control circuits, thereby, as in the semiconductor integrated circuit of the above (1), high-speed operation of the circuit blocks is enabled, and close power shutdown control can be performed correspondingly to each kind of mode while reducing the leakage current.

(4) A semiconductor integrated circuit (LSI: FIG. 10) according to still another embodiment of the invention includes a plurality of first power switches (SW21 to SW24), a plurality of second power switches (SWN11 to SWN42), first ground lines (SVSSM11 to SVSSM42), first power lines (VDDM1 to VDDM4), a plurality of third power switches (SWP11 to SWP42), second power lines (SVDDM11 to SVDDM42), a plurality of circuit blocks (IP), first control circuits (PSWC1 to PSWC4), and second control circuits (SCB1 to SCB4). The first power switches receive a power voltage (VDD), and are formed by p-channel MOS transistors. The second power switches receive a ground voltage (VSS), and are formed by n-channel MOS transistors in which the gate insulating films are thinner than gate insulating films of the first power switches. The first ground lines are connected to the plurality of second power switches respectively. The first power lines are connected to the first power switches. The third power switches are connected to the first power lines, and formed by p-channel MOS transistors in which the gate insulating films have the same thickness as thickness of the gate insulating films of the second power switches. The second power lines are connected to the plurality of third power switches. The circuit blocks are connected to the first ground lines and the second power lines respectively. The first control circuits control the first power switches individually. The second control circuits control the second power switches and the third power switches individually.

From the above, the second power switches formed by the n-channel MOS transistors having the thin gate insulating films are provided at a ground side, and the third power switches formed by the p-channel MOS transistors having the thin gate insulating films are provided at a power side, and furthermore, while the first power switches formed by the n-channel MOS transistors having the thick gate insulating films are provided at the power side, and the first power switches and the third power switches are made in a hierarchical structure respectively. Moreover, the first to third power switches are individually controlled using the first control circuits and the second control circuits. Consequently, as in the semiconductor integrated circuit of the above (3), high-speed operation of the circuit blocks is enabled, and close power shutdown control can be performed correspondingly to each kind of mode while reducing the leakage current.

(5) A semiconductor integrated circuit (LSI: FIG. 11) according to still another embodiment of the invention includes a plurality of first power switches (SW1 to SW4), first ground lines (VSSM1 to VSSM4), a plurality of second power switches (SWN110 to SWN420), second ground lines, first power lines, a plurality of circuit blocks (IF), first control circuits (PSWC1 to PSWC4), and second control circuits (SCB1 to SCB4) The first power switches receive a ground voltage (VSS). The first ground lines are connected to the first power switches. The second power switches are connected to the first ground lines. The second ground lines are connected to the plurality of second power switches respectively. The first power lines receive a power voltage (VDD). The circuit blocks are connected to the second ground lines and the first power lines respectively. The first control circuits control the first power switches individually. The second control circuits control the second power switches individually. The second power switches are formed by transistors in which the gate insulating films are thicker than gate insulating films of transistors arranged in regions of the circuit blocks, and thinner than gate insulating films of the first power switches.

From the above, the first power switches and the second power switches are arranged in a vertically stacked manner so as to be in a hierarchical structure respectively, and the power switches are individually controlled using the first control circuits and the second control circuits, therefore close power shutdown control can be performed correspondingly to each kind of mode. Moreover, since thickness of the gate insulating film of the second power switch is an intermediate thickness between thickness of the gate insulating film of the transistor included in the circuit block, and thickness of the gate insulating film of the transistor included in the first power switch, a threshold voltage of the second power switch can be made higher than the transistor included in the circuit block, consequently the leakage current can be further reduced compared with in the semiconductor integrated circuit of the (1).

As a specific mode of the embodiment of the invention, the second control circuits have level conversion circuits (LS1 to LS4) for converting voltage levels to be applied to gates of the second power switches. From the above, since the transistor included in the second power switch is high in threshold voltage compared with the transistor included in the circuit block, when a signal level is converted by the level conversion circuit, even if area of the transistor included in the second control circuit is reduced, a sufficient current can be obtained. Thus, area of the second control circuits can be reduced.

(6) A semiconductor integrated circuit (LSI: FIG. 13) according to still another embodiment of the invention includes a plurality of first power switches (SW11 to SW14), first ground lines (VSSM11 to VSSM42), a plurality of second power switches (SWN11 to SWN42), second ground lines (SVSSM11 to SVSSM42), first power lines, a plurality of circuit blocks (IP), first control circuits (PSWC11 to PSWC14), and second control circuits (SCB1 to SCB4). The first power switches receive a ground voltage (VSS). The first ground lines are connected to the first power switches. The second power switches are connected to the first ground lines. The second ground lines are connected to the plurality of second power switches respectively. The first power lines receive a power voltage (VDD). The circuit blocks are connected to the second ground lines and the first power lines respectively. The first control circuits control the first power switches individually. The second control circuits control the second power switches individually. The first power switches and the second power switches are formed by transistors in which the gate insulating films have the same thickness as thickness of gate insulating films of transistors arranged in regions of the circuit blocks. The first control circuits apply a voltage (VBN) lower than the ground voltage to gates of the first power switches.

From the above, the first power switches and the second power switches are arranged in a vertically stacked manner so as to be in a hierarchical structure respectively, and the power switches are individually controlled using the first control circuits and the second control circuits, therefore close power shutdown control can be performed correspondingly to each kind of mode. Here, while thickness of the gate insulating films of the first power switches is the same as thickness of the gate insulating films of the transistors included in the circuit blocks, that is, thin, since the first control circuits apply a negative gate voltage, the leakage current can be reduced. In addition, since the first power switch can perform the same high-speed operation as the second power switch, the semiconductor integrated circuit can perform further high-speed operation compared with the semiconductor integrated circuit of the (1).

As a specific mode of the embodiment of the invention, the number of gates in the circuit block is 100 or more. From the above, according to a result of simulation of calculating area OH based on difference in increase rate between logic part area of the circuit block corresponding to the number of gates, and SW area of the second power switches, when the number of gates is 100 or more, the area OH can be sufficiently reduced. Thus, integration of the semiconductor integrated circuit can be increased.

BRIEF DESCRIPTION OF THE DRAWINGS

FIG. 2 is an explanatory diagram illustrating a circuit configuration of logic LSI as a part of the LSI illustrated in FIG. 1;

FIG. 3A is a diagram showing a simulation result of logic part area corresponding to the number of gates;

FIG. 3B is a diagram showing a simulation result of area OH based on SW area;

FIG. 4 is a diagram showing delay time in a circuit block corresponding to an increase rate of a ground voltage VSS to a power voltage VDD;

DETAILED DESCRIPTION OF THE PREFERRED EMBODIMENT

Embodiment 1

Figure 1:
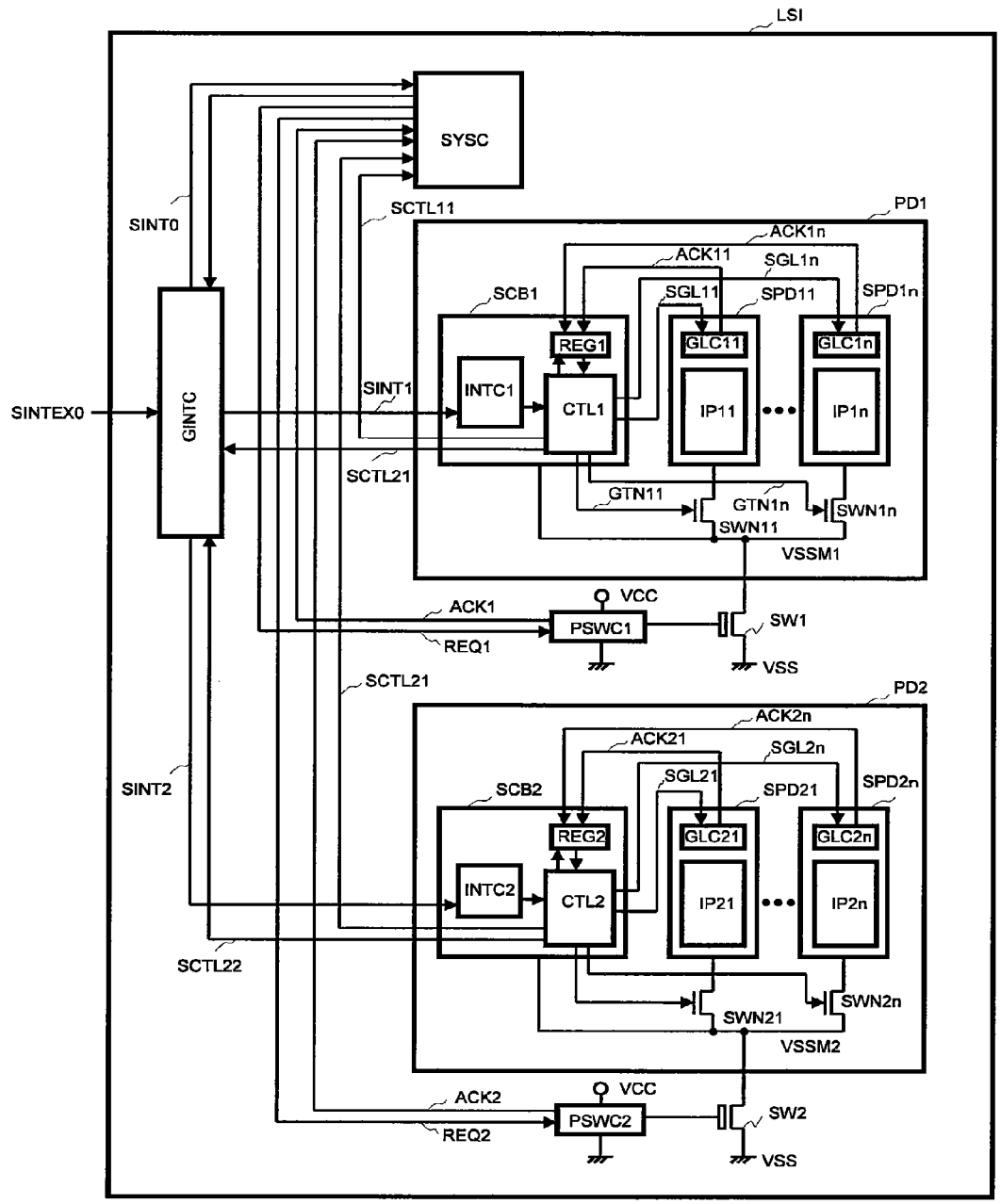
FIG. 1 is an explanatory diagram illustrating a schematic configuration of LSI configured as SoC as an example of a semiconductor integrated circuit according to embodiment 1 of the invention.

FIG. 1 illustrates a schematic configuration of LSI configured as SoC as an example of a semiconductor integrated circuit according to embodiment 1 of the invention. The LSI has first power domains PD1, PD2 which can be subjected to power shutdown using power switches SW1, SW2 for receiving a ground voltage VSS or the like, power switch controllers PSWC1, PSWC2 for controlling the power switches SW1, SW2, a global interrupt control circuit GINTC for controlling interrupt from the outside of the LSI, and a system controller SYSC for performing basic control of the LSI as a whole; which are integrated on a semiconductor substrate. The power switches SW1, SW2 are, while not particularly limited, formed by a transistor manufactured by a process common to a not-shown external input/output circuit I/O, that is, n-channel MOS transistors (hereinafter, sometimes described as thick-film power transistors) in which a gate tunnel leakage current is small because of a large thickness of a gate insulating film and a high threshold voltage. Hereinafter, the power switches SW1, SW2 are called thick-film power switches. Moreover, while two, first power domains are shown in the LSI, the number of the domains is not limited, and the domains may be integrated in the LSI by the number according to need. The insides of the first power domains PD1, PD2 are divided into a plurality of sub power domains, and second power domains SPD11 to SPD1$n$ and SPD21 to SPD2$n$ which can be subjected to power shutdown using power switches SWN11 to SWN1$n$ and SWN21 to SWN2$n$, and control circuit blocks SCB1, SCB2 which are not by way of the power switches respectively. In the second power domains, a plurality of logic blocks IP11 to IP1$n$ and IP21 to IP2$n$, which are sometimes called a plurality of IP (Intellectual Properties) modules, having predetermined functions are integrated. The logic blocks are integrated in the LSI via glue logics GLC11 to GLC1$n$ and GLC21 to GLC2$n$ being connection interface circuits. The power switches SWN11 to SWN1$n$ and SWN21 to SWN2$n$ are, while not particularly limited, formed by transistors manufactured by a process common to the logic blocks, that is, n-channel MOS transistors (hereinafter, sometimes described as thin-film power transistors) that can perform high-speed operation because of a small thickness of a gate insulating film and a low threshold voltage. Hereinafter, the power switches SWN11 to SWN1$n$ and SWN21 to SWN2$n$ are called thin-film power switches.

Next, description is made on operation that LSI shuts down power of a particular logic block in a mode where the logic block is not used. The mode corresponds to a scene of using a mobile device in the case that the LSI is used for a system for mobile device. In this case, since a logic block to be unnecessary is varied depending on a mode, the LSI needs to perform power shutdown control of a particular logic block. Hereinafter, description is made on control that the logic block IP11 is assumed as such a particular logic block, and power of the logic block IP11 is shut down with an interrupt signal SINTEX0 from the outside of the LSI. First, when the interrupt signal SINTEX0 is inputted into the GINTIC, the GINTIC outputs an interrupt signal SINT1 to an interrupt control circuit INTC1 of a control circuit block SCB1 that performs control of the logic block IP11. When the interrupt signal SINT1 is inputted into the INTC1, an internal control circuit CTL1 outputs a control signal SGL11 to the logic block IP11. The control signal SGL11 is a power shutdown request signal, and inputted into the glue logic GLC11 of the logic block IP11. As control of stopping operation of the logic block IP11, the glue logic GLC11 allows data, which have been held in a storage element such as an appropriate memory or a flip-flop, to be held in a not-shown backup circuit as needed. As control by the glue logic GLC11, which is not particularly limited, the data may be saved into a register, SRAM memory, latch circuit or the like provided outside the second power domain SPD11, or held in an information hold circuit for power shutdown period, which is formed by a flip-flop having a latch circuit driven by a different power supply. In some logic block, data holding is not necessary, and in that case, the above save or hold of data can be omitted.

Next, after the glue logic GLC11 allows the data in the logic block IP11 to be saved or held as necessary, it outputs a signal ACK11 to a register REG1 integrated in the control circuit block SCB1. The signal ACK11 is a signal for rewriting a specified bit of the REG1 for instructing execution of power shutdown control. For example, when a value of the specified bit is "0", shutdown of power of the logic block IP11 is enabled, and when the value is "1", use of the logic block IP11 is enabled. The CTL1 reads the value of the specified bit of the REG1, and when the value is "0", it applies a voltage shown by GTN11 to a gate of a corresponding thin-film power switch SWN11 to allow the thin-film power switch SWN11 to be off. When a signal is outputted from the logic block IP11 to an external circuit such as the control circuit block SCB1, transmission of an irregular signal needs to be prevented during power shutdown, however, such control can be performed by the CTL1 using the control signal SGL11.

Next, description is made on operation of returning the logic block IP11 being shut down in power. First, the CTR1 performs control of allowing the thin-film power switch SWN11 for the logic block IP11 to be on, and after the thin-film power switch SWN11 is perfectly on, the CTR1 performs operation setting of the logic block IP11. Whether the thin-film power switch SWN11 is perfectly into an on-state or not may be determined by measuring a fact that a gate signal of the thin-film power switch SWN11 is in high by, for example, using an unshown sensor circuit, or may be determined by setting a sequencer or the like such that timing at which the switch is perfectly into the on-state is previously calculated by simulation, and subsequent control is performed at an interval of such timing.

Next, description is made on operation setting of the logic block IP11 after the thin-film power switch SWN11 is into the on-state. First, when the thin-film power switch SWN11 is into the on-state, the CTL11 outputs a signal instructing start of operation to the GLC11 of the logic block IP11. When the signal is inputted, the GLC11 drives a sequencer or the like within the GLC11 such that data saved before power shutdown is returned, and thus controls data transfer from an external storage device. When data are not saved before power shutdown, the above operation can be omitted. Then, for example, the GLC11 cancels gating of clock to start supply of clock in order to start operation of the logic block IP11. When the processing for starting operation of the logic block IP11 in this way is completed, the GLC11 rewrites a value of the specified bit of the REG1, which corresponds to the logic block, to be "1". Thus, the logic block IP11 becomes available. Other logic blocks IP12 to IP1$n$ can be subjected to power shutdown control by the control circuit block SCB1 as the logic block IP11.

Next, description is made on a case of performing power shutdown of the first power domain PD1. The first power domain PD1 is subjected to power shutdown when none of the control circuit block SCB1 and the second power domains SCB11 to SCB1$n$ is operated, that is, in a mode that the logic blocks IP11 to IP1$n$ are not used. The power shutdown is controlled by the system controller SYSC. The SYSC outputs a REQ1 signal for allowing the thick-film power switch SW1 to be off to the PSWC1 for controlling a corresponding thick-film power switch SW1. When the REQ1 signal is inputted, the PSWC1 allows the thick-film power switch SW1 to be off, and furthermore, informs the SYSC of a fact that the first power domain PD1 is in a power shutdown condition by outputting an ACK1 signal to the SYSC. On the other hand, in the case that power of the first power domain PD1 is allowed to be on, the SYSC outputs a REQ1 signal for allowing the thick-film power switch SW1 to be on to the PSWC1. Then, the PSWC1 allows the thick-film power switch SW1 to be on, and furthermore, informs the SYSC of a fact that the first power domain PD1 becomes operable by outputting an ACK1 signal to the SYSC.

FIG. 2 shows the logic LSI as a part of the LSI illustrated in FIG. 1. Here, connection relationships between various wiring lines in the logic LSI are shown in detail. The logic LSI has a plurality of first power domains PD1 to PD4 each of which is divided into sub power domains as described before. The sub power domains include a plurality of second power domains SPD11 to SPD42, and control circuit blocks SCB1 to SCB4. Each of the second power domains SPD11 to SPD42 is configured by a logic block including many transistors having a low threshold voltage. Therefore, the logic block is a circuit block that can perform high-speed operation. Here, since configurations of the first power domains PD1 to PD4 are approximately the same, only the first power domain PD1 is described for convenience of description.

The first power domain PD1 includes virtual ground lines VSSM1 for receiving a ground voltage VSS, the lines VSSM1 being connected to the thick-film power switch SW1; a plurality of thin-film power switches SWN11, SWN12 connected to the virtual ground lines VSSM1; the second power domains SPD11, SPD12; and a control circuit block SCB1, and the like. The second power domains SPD11, SPD12 include sub virtual ground lines SVSSM11, SVSSM12 connected to the thin-film power switches SWN11, SWN12 respectively, and a logic block. The logic blocks are connected to the sub virtual ground lines SVSSM11, SVSSM12, and power lines VDDM1 for receiving a power voltage VDD. In the control circuit block SCB1, a control circuit for individually controlling the plurality of thin-film power switches SWN11, SWN12 or the like, and a circuit block such as various registers or control circuits being most fundamental in the first power domain PD1 are integrated. In the second power domains SPD11 and SPD12, CPU or DSP being omitted to be shown, other hardware accelerators and the like are integrated.

In the LSI, the thick-film power switches SW1 to SW4 are controlled by power switch controllers PSWC1 to PSWC4 each of which can apply a high voltage to a gate of the power switch. As described before, the thick-film power switches SW1 to SW4 are formed by thick-film power transistors having a large thickness of the gate insulating film compared with the thin-film transistors included in the logic block, so that the gate tunnel leakage current can be reduced therein compared with in the thin-film transistor. Furthermore, since the thick-film power transistor is a highly-durable transistor that can be applied with a high gate voltage compared with the thin-film transistor, even if a high threshold voltage is set therein, a sufficiently low on-resistance is obtained. Therefore, the power switch controllers PSWC1 to PSWC4 allow the thick-film power switches SW1 to SW4 to be off, thereby a sub threshold leakage current can be reduced compared with in the thin-film transistor. Moreover, since the thick-film VCC power switches SW1 to SW4 can be operated at a higher voltage than the power voltage VDD, they cannot be designed by the same circuits as circuits of the second power domains SPD11 to SPD42, or circuits of the control circuit blocks SCB1 to SCB4. Therefore, the power switch controllers PSWC1 to PSWC4 are needed. The power switch controllers PSWC1 to PSWC4 are arranged in a partial region on a semiconductor substrate in a concentrated manner to reduce area in consideration of wiring of lines of the power voltage VCC (see FIG. 6).

The thin-film power switches SWN11 to SWN42 control power supply to the second power domains SPD11 to SPD42, which are enabled to be controlled by control signals by the control circuit blocks SCB1 to SCB4 in the first power domains PD1 to PD4 respectively. This is because the thin-film power switches SWN11 to SWN42 can be operated at the same power voltage VDD as in the transistors configuring the control circuit blocks SCB1 to SCB4 or circuit blocks of the second power domains SPD11 to SPD42. In this way, since the thin-film power switches SWN11 to SWN42 can be controlled by the control circuit blocks SCB1 to SCB4, circuits of the switches can be designed using logic synthesis. Thus, the thin-film power switches SWN11 to SWN42 can be easily controlled by the control circuit blocks SCB1 to SCB4.

Next the area OH is described. The area OH refers to a ratio (%) of SW area of the thin-film power switch SWN11 to the total area of a logic part area corresponding to the number of gates of the circuit block such as the logic block IP11 and the SW area. The thin-film power switch SWN11 is controlled in the following way; transistors in the same kind of those in the logic part such as N-channel MOS transistors are connected in series, and one of the transistors is subjected to off-control, thereby the switch SWN11 is controlled. When the power switch is integrated, transistors added as the switch are seen as a resistance during operation (on-resistance of transistor), which typically cause reduction in speed. For example, while a 2-input NAND circuit is considered as the simplest circuit using the N-channel MOS transistors as a switch, it is a well-known fact to those skilled in the art that delay in signal transmission is significantly increased in the NAND circuit compared with in an inverter circuit being simplest in CMOS circuits. This is because increase in on-resistance by vertically stacking the transistors significantly affects the delay. Typically, transistors are vertically stacked, thereby in a transistor of a second stage connected via a transistor of a first stage from a power line, since a source potential of the transistor of the second stage rises due to potential drop caused by on-resistance of the transistor of the first stage, even if a gate voltage of the transistor of the first stage is equal to a gate voltage of the transistor of the second stage, on-resistance of the transistor of the second stage is higher than on-resistance of the transistor of the first stage due to a substrate effect. Therefore, the NAND circuit operates slow compared with the inverter circuit. Since the NAND circuit and the like are required to have a logic operation function rather than high operation speed, they are designed with minimal area, thereby they are slow in operation speed compared with the inverter circuit. To increase speed of the 2-input NAND circuit, it is necessary that gate width of the transistor of the first stage as a switch is increased to gain a current, and potential drop of the first transistor is minimized to reduce on-resistance of the transistor of the second stage. Generally, a transistor has a feature that a current flows more easily therein in proportion to increase in gate width. This means that on-resistance is reduced in inverse proportion to gate width. Therefore, gate width of the transistor of the first stage needs to be set approximately 5 to 10 times as large as original width in order to make the speed of the NAND circuit approach original speed of the inverter. Next, a case that such a power switch is used for a region of a circuit block is considered. Typically, in a CMOS circuit, a signal is transmitted to a circuit of a subsequent stage at a speed of several tens of picoseconds to several hundred picoseconds. Such transmission time is approximately equal to time of circuit operation (for example, time in which a state of an inverter is changed from HI into LO). Moreover, in a typical synchronous CMOS logic circuit, operation is repeated in a period of a clock signal. While a combination of logic is changed in each period, operation probability of a circuit is considered to be approximately the same. When 300 MHz operation is considered, a period of a clock is 3.3 ns, and signal transmission is performed from a flip-flop (FF) to another FF in the period. Logic circuits can be integrated by the number corresponding to the number of circuits to which signals can reach in the period. For example, when the number of stages of logic of signal transmission is assumed to be 20, for example, 10 stages of circuits having logic delay of 30 ps, and 9 stages of circuits having logic delay of 300 ps can be mounted as details. This is merely an example, and the logic circuits can be designed such that circuits having various periods of delay are set within 3.3 ns. Considering in this way, current consumption can be regarded as consumption of a current averaged with a clock period. That is, since a signal outputted from FF is inputted into a circuit of a first stage, then the signal is sequentially transmitted while a current consumption position is changed, and finally the signal arrives at FF of a final stage, when power consumption in each moment is considered, current consumption in such circuits can be considered as power consumption of one circuit or adjacent, several circuits, rather than current consumption in such circuits in the case that all the circuits are concurrently operated. Therefore, when a power switch is used for a logic circuit block, the power switch is commonly provided in the logic circuit block, thereby a current consumed by a plurality of circuits is supplied by one power switch in a temporally dividing manner, and therefore size of the power switch can be reduced compared with a case that each circuit is added with a switch. In other words, when a power switch is provided in each circuit, while the power switch is used during operation of each circuit, after signal transmission into the relevant circuit is finished, the power switch does not fulfill a function of current supply. On the contrary, when a plurality of circuits share a power switch, the power switch effectively continues to work during a period in which a circuit covered by the power switch operates. Even in the case, since a supply current can have size enough to suit operation of at most several circuits, size of the power switch can be reduced. Furthermore, a case that the power switch is used for a somewhat larger circuit block is considered. In that case, probability of activation of a signal path itself from FF to another FF is newly added to items to be considered. Generally, a logic circuit has a plurality of signal processing paths, and a signal transmission path is typically changed depending on the content of operation. For example, when a program is considered, conditional branching is given. In the conditional branching, a plurality of calculation paths are selected according to a condition for operation. Therefore, when a circuit scale is increased, distribution of operation or non-operation of circuits tends to effectively appear. While operation probability (hereinafter, called activation ratio) of a circuit is changed depending on a property of a program to be operated, it is considered to be at most about 10%. Such an activation ratio can be defined only in a somewhat large circuit scale.

Using the activation ratio as an index, simulation was carried out on a relationship between a circuit scale and size of a power switch. FIG. 3A illustrates area of a logic part and SW area corresponding to the number of gates. In the figure, a horizontal axis shows the number of gates, and a vertical axis shows area (arbitrary value). Since area of the logic part is in proportion to the number of gates, it is normalized with the number of gates, and area of the power switch is normalized with gate area. A result of the simulation was obtained under a condition that an activation ratio of the circuit block was constant, and a precondition described later. As a result, an expression (1) showing the area of the logic part corresponding to the number of gates, and an expression (2) showing the SW area were obtained. However, the number of gates$\geq 10$ was assumed in the simulation.

Area of the logic part=number of gates      expression (1)

$SW$ area=0.06*(number of gates)+5.15      expression (2)

In the precondition of the simulation, a case that the power switch is used for a high-speed inverter (for example, inverter including transistors having a low threshold voltage) while keeping high speed of the inverter is considered. As clear from the above expressions, a feature is given, that is, while area of the logic part is in proportion to the number of gates, area of the power switch takes a constant value in a range of small gate number, in addition, increase in acceleration is one order of magnitude smaller than increase in acceleration of area of the logic part. In this example, since circuits needs to be designed using transistors having a small threshold voltage of the logic part circuit, and a large threshold voltage of the power switch, the constant value (y-intercept in the expression 2) is comparatively large, and consequently the area OH is large. Here, it is shown that in the case that the number of gates is 10, a power switch having area 5.75 times as large as original area is necessary. However, it is further shown that as the number of gates increases, overhead area of the power switch is relatively reduced. It reflects a fact that increase in operational average of a circuit becomes sufficiently small compared with increase in gate scale due to time-sharing operation of the circuit as described before. While the y-intercept in the expression 2 is an important factor in considering the area OH, since on-resistance of a transistor is in inverse proportion to gate width, even if size of the power switch is further increased, an effect of increase in speed is reduced. Therefore, the y-intercept shows minimum necessary area for satisfying speed to be required. When a value of the y-intercept is smaller than the relevant value, operation speed does not meet the speed to be required. When the value of the y-intercept is larger than the relevant value, cost increase is caused due to increase in area. While this is merely a numerical value in the case that one process technology is supposed, it is considered that an essential relationship does not deviate from such a relationship as long as a CMOS technology is used.

According to the expressions (1) and (2), it is known that a ratio of increase in area of the logic part is larger than a ratio of increase in SW area due to difference in slope of a linear function. The reason for this is as follows: for example, when predetermined processing is performed in the logic block IP11, an activation ratio of the logic block IP11 is typically about 10%, and in this case, all the thin-film power transistors configuring the thin-film power switch SWN11 are responsible for supplying currents to activated logic circuits among a plurality of logic circuits included in the logic block IP11. In a word, while area (size) of the thin-film power transistors to be necessary for activating respective logic circuits included in the logic block IP11 is not changed, other thin-film power transistors arranged near logic circuits being unnecessary to be activated also supply currents to the logic circuits being necessary to be activated. In other words, this means that since other thin-film power transistors take part of power supply to the logic circuits, effective SW area, that is, total area of all the thin-film power transistors configuring the thin-film power switch SWN11 can be reduced. Thus, when the number of gates increases in some degree, the area OH can be controlled to be small.

FIG. 3B illustrates area OH corresponding to the number of gates. In the figure, a horizontal axis shows the number of gates, and a vertical axis shows area OH (%). Here, for example, data are plotted such that a rate of increase in potential of the virtual ground lines VSSM1 is constant to voltage drop of the thin-film power switch SWN11 due to DC-like current consumed by the logic circuits in the logic block IP11. As a result, as the number of gates is increased, the area OH is decreased as shown in the figure. Specifically, as the number of gates is increased in order of 10, 20, 30, 40, 50, 100, 1000, 10000, and 100000, the area OH is decreased in order of 36.54, 24.13, 18.83, 15.9, 14.1, 10.11, 6.14, 5.74 and 5.7 respectively. According to the simulation result, it is known that the area OH is abruptly decreased in a gate number range of 10 to 100, and gradually decreased in a gate number range of 100 to 100000. In a word, when the number of gates is 100 or more, the area OH can be sufficiently reduced. In actual LSI, when a circuit scale is small, a high activation ratio must be considered in most cases as described before. Considering that the activation ratio is increased in the case that the number of gates is smaller in this way, it is highly possible that area OH in a region of small number of gates is large compared with that in the above estimation.

Since a logic block defined by a logic circuit is generally considered to be a basic unit of the block to be subjected to bus connection, a logic scale of the block is designed to be sufficiently large compared with a logic scale of a bus connection interface. Therefore, the logic scale of the block typically reaches to about 10 kilo gates, that is, the number of gates is about 10,000 even in a logic block having the smallest logic scale. Calculation is made assuming that one gate corresponds to one 2-input NAND. When power shutdown is performed with such a logic block as a unit, the area OH illustrated in the figure can be set extremely small, 5.74%. For such a large-scale circuit, supposition in the above simulation is approximately true, consequently the area OH is also true. In this way, the reason for dividing the second power domains SPD11 to SPD42 with the logic block as a unit is that when the number of gates of the logic block is 100 or more, the area OH can be sufficiently reduced.

Next, description is made on a relationship between vertical stacking of the thick-film power switch SW1 and the thin-film power switch SWN11 via the virtual ground line VSSM1, namely, series connection of the power switches, and operation speed. Vertical stacking of power switches has been regarded to be not preferable. This is because on-resistances of transistors are connected in series, causing reduction in on-current, consequently reduction in operation speed is concernedly caused. Therefore, vertically-stacked power switches are provided in a circuit block consuming a large current such as the logic block only in the case that speed reduction is allowed.

Figure 7:
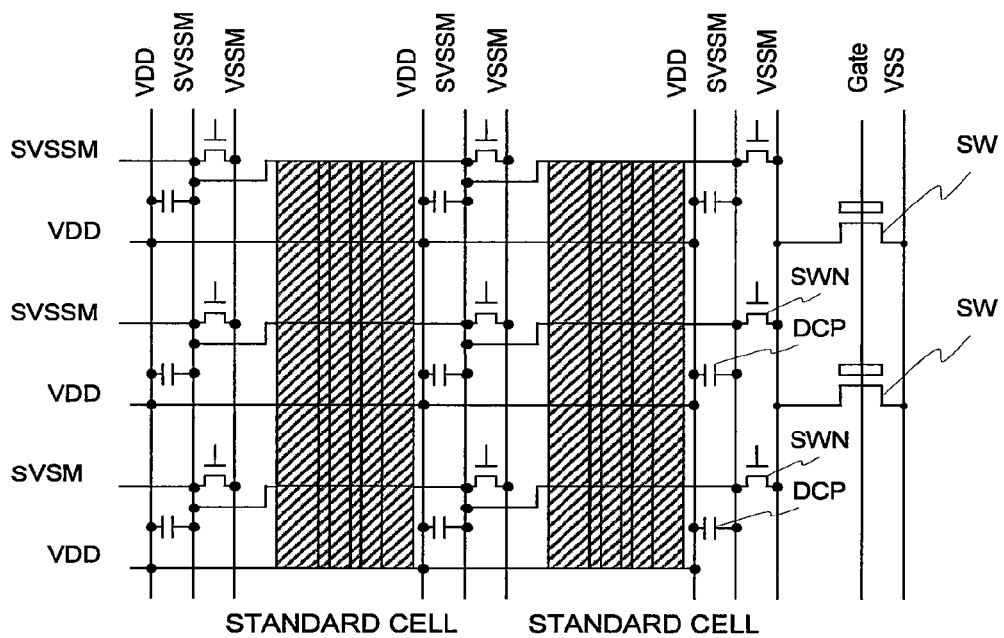
FIG. 7 is an explanatory diagram illustrating an example of integrating thick-film power switches and thin-film power switches in LSI.

On the contrary, in the LSI, for example, the sub virtual ground lines SVSSM11 connected to the thin-film power switch SWN11 are in a mesh structure, that is, wired with being approximately uniformly conducted in a region of the logic block IP11, and furthermore, thin-film power transistors of the thin-film power switch SWN11 are dispersedly arranged on the sub virtual ground lines SVSSM11, thereby reduction in impedance can be sufficiently achieved (see FIG. 7). Therefore, the thin-film power switch SWN11 as a whole can be grasped as a parallel resistance of a plurality of thin-film power transistors. Therefore, when the number of gates is, for example, 100 or more, since an effective on-resistance of the thin-film power switch SWN11 corresponding to the gates can be sufficiently reduced, increase in on-resistance due to vertical stacking is avoided. Furthermore, focusing the logic circuits activated when predetermined processing is performed in the logic block, the thin-film power transistors are shared, and therefore effective size of the thin-film power switch SWN11 is not reduced. As a result, even if the area OH is reduced correspondingly to the number of gates of the integrated logic block IP11, reduction in operation speed is not caused. Hereinafter, this is specifically described. FIG. 4 illustrates delay time in a circuit block corresponding to a rising rate of the ground voltage VSS to the power voltage VDD. The delay time in the circuit block can be grasped as speed reduction in the case that voltage drop occurs due to the power switch, and thereby potential of the virtual ground line VSSM rises. Evaluation results in the figure are results of investigation on reduction in speed of a single inverter circuit. Here, reduction in speed of the logic block as a circuit block has an extremely slight effect on operation speed in the case of potential rise of about 0.5%. In such a case, a rate of speed reduction was about 1%. The area OH according to the above simulation is calculated on a condition that potential rise of 0.5% is allowed. Even in the case of potential rise of about 1%, the rate of speed reduction was about 2%. In this way, an effect of the power switch on speed reduction was investigated in detail, as a result, it was known that even if the thick-film power switch SW1 and the thin-film power switch SWN11 were vertically stacked, when the area OH was about 10%, operation speed performance was obtained, which bore comparison with operation speed in the case that power shutdown was performed without stacking the switches.

In a word, the thin-film power switches are appropriately used, thereby an effect is given: power shutdown control can be closely carried out without causing usually concerned, increase in speed reduction due to vertically-stacked power switches.

Figure 5:
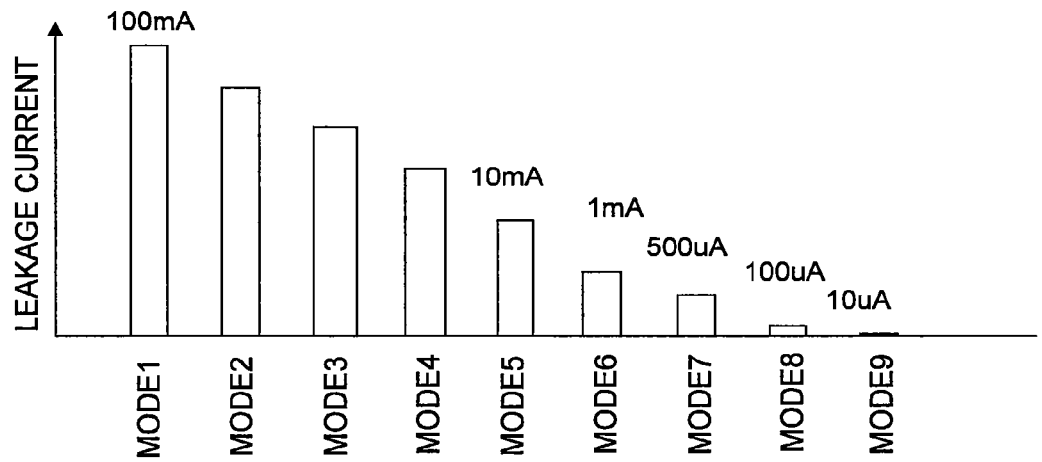
FIG. 5 is an explanatory diagram illustrating the amount of leakage current in each mode.

FIG. 5 illustrates a leakage current in each mode. In the figure, a horizontal axis shows the mode, and vertical axis shows the leakage current. Modes 1 to 5 are modes during operation. Modes 6 to 10 are modes during standby. In the mode 1, all the circuit blocks are on, and a leakage current is 100 mA in this case. In the mode 2, circuit blocks being unnecessary to be operated are 10% of all the circuit blocks, which are subjected to power shutdown with the second domain SPD as a unit. An effect of reducing the leakage current due to power shutdown of the second domain SPD is varied by a relationship between the threshold voltage of the transistors configuring the logic block included in the second domain SPD and the threshold voltage of the thin-film power transistors of the thin-film power switches, and a current necessary for operating the logic block.

For example, when it is assumed that the threshold voltage of the transistors configuring the logic block is different by 0.1 V from the threshold voltage of the thin-film power transistors of the thin-film power switches, the leakage current is changed approximately one digit. Furthermore, when width of the thin-film power transistors is tenth part of width of the transistors configuring the logic block, the leakage current is decreased to hundredth part in conjunction with an effect of difference in threshold voltage. In a word, since the leakage current is decreased two digits, it is known that in consideration of the amount of leakage current in the mode 1, power consumption can be reduced by 10% in the mode 2 by performing power shutdown of the circuits being unnecessary to be operated. In the modes 3 and 4, a ratio of the circuit blocks being unnecessary to be operated is increased compared with in the mode 2, consequently the leakage current can be further reduced. In this way, a circuit scale to be necessary is reduced, and the amount of leakage current can be reduced with increase in mode number. In the mode 5, all the second power domains SPD are subjected to power shutdown. At that time, when 10% of the whole circuit block is assumed to be supplied with current, the leakage current is decreased to tenth part compared with in the mode 1, that is, 10 mA. In a word, the thin-film power switches are controlled for each second power domain PD in the modes 1 to 5.

On the contrary, in modes 6 to 9, power shutdown is performed for each first power domain PD during standby. The first power domain PD is subjected to power shutdown by the thick-film power switches, so that the leakage current can be drastically reduced. For example, the threshold voltage of the transistors configuring the logic block is different by at least about 0.3 V from the threshold voltage of the thick-film power transistors of the thick-film power switches. Therefore, the leakage current can be reduced to about thousandth part. Furthermore, when width of all gates of the thick-film power switch is tenth part compared with width of all gates of transistors included in the circuit block in the first power domain PD, the leakage current can be reduced to ten-thousandth part. For example, in the mode 6, only one circuit block is supplied with current to be in a standby state, and the leakage current is 1 mA. In the mode 7, only one circuit block is subjected to limited current supply to be in a standby state, and the leakage current is 500 μA. The limited current supply refers to current supply to a circuit block which is limitedly used in a partial region in the second power domain SPD. In this case, the circuit block may be a logic block, for example, in a logic scale of the number of gates of about 100, and the area OH can be controlled to be about 10% as shown in the FIG. 3B. In the mode 8, only one circuit block is subjected to limited current supply, and furthermore, the circuit block is made into a standby state with a voltage being lowered for low-speed operation, and the leakage current is 100 μA. In the mode 9, all the first power domains PD are subjected to power shutdown, and the leakage current is 10 μA.

Consequently, control in combination of power shutdown by the thin-film power switches in the modes 1 to 5 and power shutdown by the thick-film power switches in the modes 6 to 9 is performed, thereby the circuit blocks being unnecessary to be operated are subjected to power shutdown, and only the minimum necessary circuit blocks are supplied with current, and consequently the leakage current can be reduced. According to this, logic LSI can be designed, which performs appropriate power supply corresponding to a mode, while many functions are integrated in one LSI. As a result, high-performance LSI can be achieved while the total leakage current in LSI configured as SoC is reduced.

Figure 6:
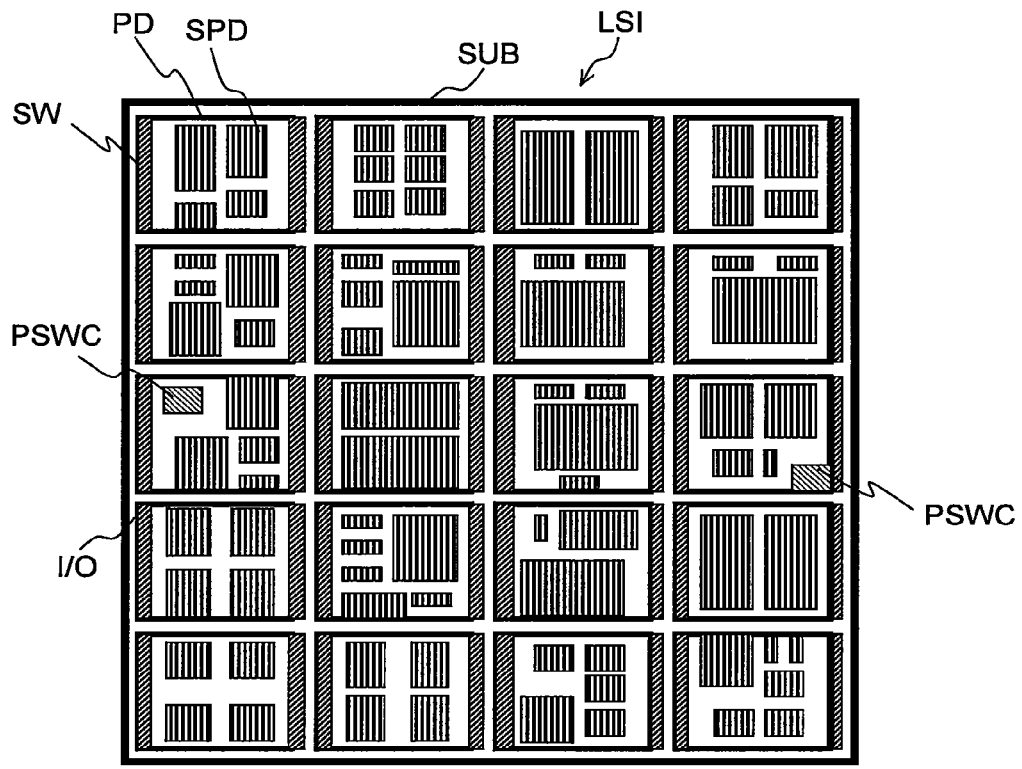
FIG. 6 is an explanatory diagram illustrating a layout configuration of LSI configured as SoC.

FIG. 6 illustrates a layout of LSI configured as SoC. Here, twenty, first power domains PD, and a plurality of second power domains SPD are illustrated, which are integrated on a semiconductor substrate SUB. The thick-film power switches SW are arranged in both ends of each first power domain PD. Power switch controllers PSWC are arranged in limited regions on the semiconductor substrate SUB. In the LSI, since when the number of gates of the logic block in the second power domain SPD is 100 or more, the area OH can be reduced as illustrated in FIG. 3B, for example, about one hundred, first power domains PD can be defined on the semiconductor substrate SUB. The number of the first power domains PD is increased, and the thick-film power switches SW and the thin-film power switches are combined for power shutdown control, thereby power shutdown control is performed more closely, and consequently reduction in leakage current corresponding to each mode can be achieved.

FIG. 7 shows an integration example of the thick-film power switches and the thin-film power switches in LSI. In the figure, a region shown by oblique lines is assumed as a standard cell, and VDD for supplying current to the standard cell is also illustrated. The standard cell corresponds to the circuit block. Here, SW in the figure is shown as a plurality of thick-film power transistors configuring the thick-film power switch SW1 illustrated in FIG. 1, and similarly SWN in the figure is shown as a plurality of thin-film power transistors configuring the thin-film power switch SWN11 illustrated in FIG. 1. In the LSI, the virtual ground lines VSSM for receiving the ground voltage VSS, which are connected via the thick-film power transistors SW, are wired in a mesh pattern in the first power domain PD so as to be reduced in impedance. Similarly, power lines for receiving the power voltage VDD are wired in a mesh pattern in the first power domain PD so as to be reduced in impedance. Moreover, the sub virtual ground lines SVSSM connected to one another via the virtual ground lines VSSM and the thin-film power transistors SWN are similarly wired in a mesh pattern so as to be reduced in impedance. Since the sub virtual ground lines SVSSM are ground lines near the circuit blocks to be subjected to power shutdown, they are desirably in a mesh structure using a lower power line layer in a semiconductor substrate. Moreover, the virtual ground lines VSSM are made in a mesh structure using a higher power line layer in a semiconductor substrate, thereby area of the lines can be reduced. The thin-film power switches SWN11 are formed by the thin-film power transistors SWN having the same thickness of the gate insulating film as that of the circuit block as described before, and a large number of the switches SWN11 need to be integrated to achieve reduction in impedance. Therefore, the thin-film power transistors SWN are dispersedly arranged in the second power domain SPD as the standard cells. Furthermore, stabilizing capacitances DCP are integrated between the power voltage VDD and the sub virtual ground lines SVSSM. According to this, voltage drop can be controlled to be minimal. The thick-film power transistors SW are desirably integrated under longitudinal power trunk lines so as to be mounted while being prevented from increase in area.

Embodiment 2

Figure 8:
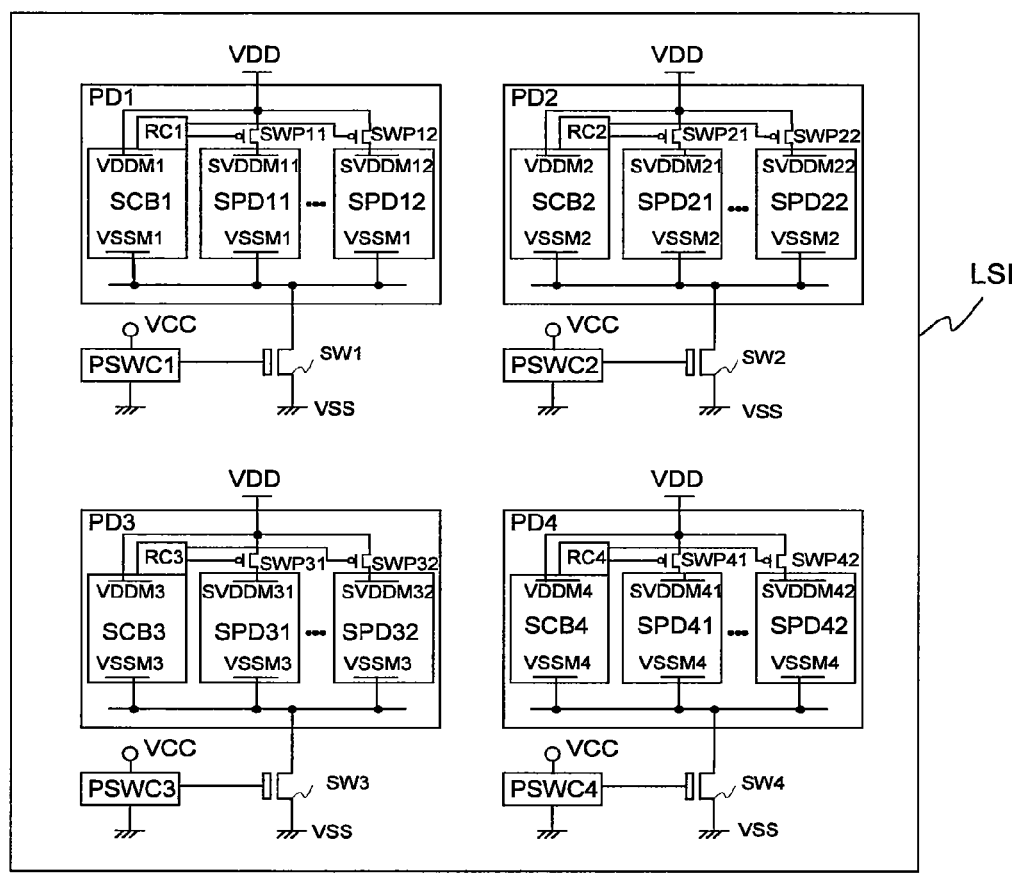
FIG. 8 is an explanatory diagram illustrating a circuit configuration of logic LSI according to embodiment 2 of the invention.

FIG. 8 shows a circuit configuration example of logic LSI according to embodiment 2 of the invention. Hereinafter, in each embodiment, portions having the same function and the like as those of the logic LSI according to the embodiment 1 are marked with the same references, and overlapped description is appropriately omitted. Here, the logic LSI includes a plurality of first power domains PD1 to PD4, thick-film power switches SW1 to SW4 that receives the ground voltage VSS, and are formed by n-channel MOS transistors, and power switch controllers PSWC1 to PSWC4 for controlling the thick-film power switches SW1 to SW4, therein. The first power domains PD1 to PD4 have a plurality of second power domains SPD11 to SPD42; control circuit blocks SCB1 to SCB4; power lines VDDM1 to VDDM4 for receiving the power voltage VDD; thin-film power switches SWP11 to SWP42 that are connected to the power lines VDDM1 to VDDM4 respectively, and formed by p-channel MOS transistors; and control circuits RC1 to RC4. The thick-film power switches SW1 to SW4 are connected with virtual ground lines VSSM1 to VSSM4. The thin-film power switches SWP11 to SWP42 are connected with virtual power lines SVDDM11 to SVDDM42. Logic blocks as circuit blocks are connected between the virtual ground lines VSSM1 to VSSM4 and the virtual power lines SVDDM11 to SVDDM42.

Gates of the thin-film power switches SWP11 to SWP42 are connected with control circuits RC1 to RC4. The control circuits RC1 to RC4 allow the thin-film power switches SWP11 to SWP42 to function as regulators. According to this, while voltages of the second power domains SPD11 to SPD42 are lowered during standby to reduce a leakage current, an internal condition can be kept. For example, when a voltage is lowered by the thin-film power switch SWP11, the control circuit RC1 performs switch control intermittently to the thin-film power switch SWP11. Furthermore, the control circuit allows the second power domains to operate with a voltage being lowered during low-speed operation, thereby power consumption can be reduced.

Embodiment 3

Figure 9:
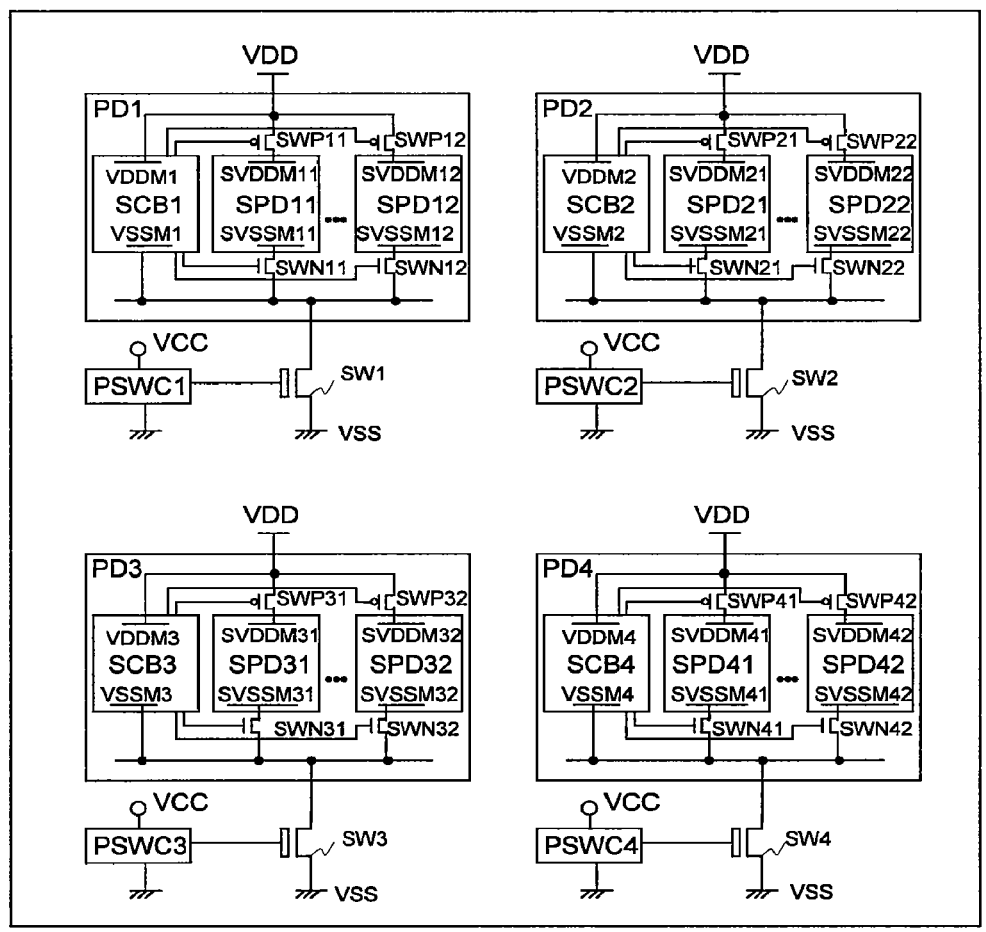
FIG. 9 is an explanatory diagram illustrating a circuit configuration of logic LSI according to embodiment 3 of the invention.

FIG. 9 shows a circuit configuration example of logic LSI according to embodiment 3 of the invention. Here, the logic LSI includes a plurality of first power domains PD1 to PD4, thick-film power switches SW1 to SW4, and power switch controllers PSWC1 to PSWC4, therein. The first power domains PD1 to PD4 include a plurality of second power domains SPD11 to SPD42; control circuit blocks SCB1 to SCB4; power lines VDDM1 to VDDM4 for receiving the power voltage VDD; thin-film power switches SWP11 to SWP42 that are connected to the power lines VDDM1 to VDDM4 respectively, and formed by p-channel MOS transistors; and thin-film power switches SWN11 to SWN42 that are connected to the thick-film power switches SW1 to SW4 via virtual ground lines VSSM1 to VSSM4 respectively, and formed by n-channel MOS transistors. The control circuit blocks SCB1 to SCB4 can control the thin-film power switches SWP11 to SWP42 and SWN11 to SWN42.

The second power domains SPD11 to SPD42 include virtual power lines SVDDM11 to SVDDM42 connected to the thin-film power switches SWP11 to SWP42, sub virtual ground lines SVSSM11 to SVSSM42 connected to the thin-film power switches SWN11 to SWN42, and circuit blocks. As the circuit blocks, logic blocks connected between the virtual power lines SVDDM11 to SVDDM42 and the sub virtual ground lines SVSSM11 to SVSSM42 are given.

In this way, the thin-film power switches SWP11 to SWP42 are arranged at a power side, and the thin-film power switches SWN11 to SWN42 are arranged at a ground side, and furthermore, the thin-film power switches SWP1 to SWP42 and the thick-film power switches SW1 to SW4 are in a hierarchical structure respectively. Thus, while an increase rate of SW area corresponding to the number of gates of a circuit block is somewhat increased, since threshold voltages of the thin-film power switches are apparently increased due to a substrate effect, the leakage current can be further reduced. Moreover, the thick-film power switches and the thin-film power switches are combined, thereby close power shutdown control can be performed correspondingly to a mode. Moreover, gates of the thin-film power switches SWP11 to SWP42 may be connected with the control circuits RC1 to RC4 illustrated in the embodiment 2. In this case, reduction in leakage current during standby, and reduction in power consumption during low-speed operation can be achieved as described before.

Embodiment 4

Figure 10:
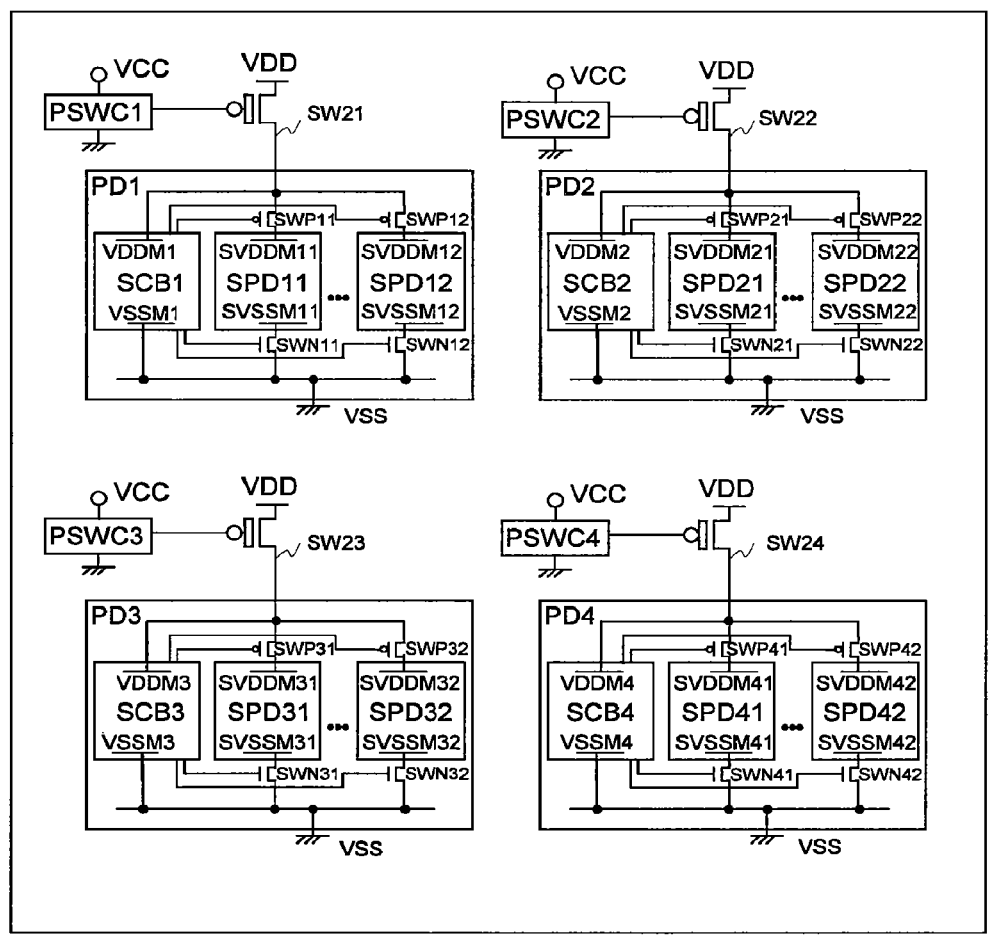
FIG. 10 is an explanatory diagram illustrating a circuit configuration of logic LSI according to embodiment 4 of the invention.

FIG. 10 shows a circuit configuration example of logic LSI according to embodiment 4 of the invention. Here, the logic LSI includes a plurality of first power domains PD1 to PD4, thick-film power switches SW21 to SW24, and power switch controllers PSWC1 to PSWC4, therein. The thick-film power switches SW21 to SW24 receive the power voltage VDD, and are formed by p-channel MOS transistors. The first power domains PD1 to PD4 include a plurality of second power domains SPD11 to SPD42; control circuit blocks SCB1 to SCB4; thin-film power switches SWP11 to SWP42 that are connected to the thick-film power switches SW21 to SW24 via the virtual power lines VDDM1 to VDDM4 respectively, and formed by p-channel MOS transistors; and thin-film power switches SWN11 to SWN42 that receive the ground voltage VSS, and are formed by n-channel MOS transistors.

The control circuit blocks SCB1 to SCB4 can control the thin-film power switches SWP11 to SWP42 and SWN11 to SWN42.

The second power domains SPD11 to SPD42 include virtual power lines SVDDM11 to SVDDM42 connected to the thin-film power switches SWP11 to SWP42, sub virtual ground lines SVSSM11 to SVSSM42 connected to the thin-film power switches SWN11 to SWN42, and circuit blocks. As the circuit blocks, logic blocks connected between the sub virtual power lines SVDDM11 to SVDDM42 and the sub virtual ground lines SVSSM11 to SVSSM42 are given. According to this, high-speed operation of the circuit blocks is enabled, and close power shutdown control can be performed correspondingly to a mode while reducing the leakage current as the logic LSI of the embodiment 3.

Embodiment 5

Figure 11:
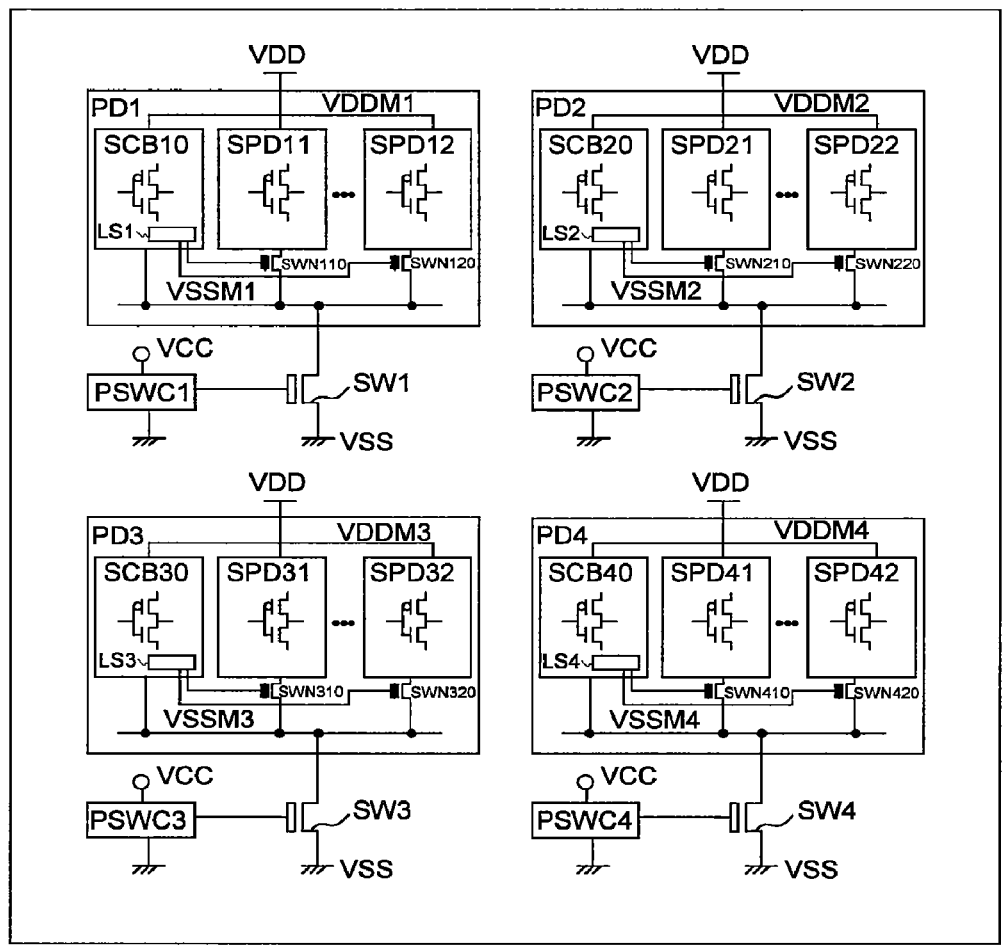
FIG. 11 is an explanatory diagram illustrating a circuit configuration of logic LSI according to embodiment 5 of the invention.

FIG. 11 shows a circuit configuration example of logic LSI according to embodiment 5 of the invention. Here, the logic LSI includes a plurality of first power domains PD1 to PD4, thick-film power switches SW1 to SW4, and power switch controllers PSWC1 to PSWC4, therein. The first power domains PD1 to PD4 include a plurality of second power domains SPD11 to SPD42; control circuit blocks SCB10 to SCB40; and power switches SWN110 to SWN420 being connected to the thick-film power switches SW1 to SW4 via the virtual ground lines VSSM1 to VSSM4 respectively. The second power domains SPD11 to SPD42 include circuit blocks connected to power lines VDDM1 to VDDM4 for receiving the power voltage VDD, and not-shown sub virtual ground lines connected to the power switches SWN110 to SWN420. The power switches SWN110 to SWN420 are formed by power transistors in which the gate insulating films are thicker than gate insulating films of thin-film transistors arranged in regions of the circuit blocks, and thinner than gate insulating films of the thick-film power switches SW1 to SW4. The control circuit blocks SCB10 to SCB40 include level conversion circuits LS1 to LS4 for converting levels of voltages applied to gates of the power switches SWN110 to SWN420.

According to this, since the power transistors forming the power switches SWN110 to SWN420 may have high threshold voltage compared with the thin-film transistors, the leakage current can be further reduced. Moreover, since the power switches SWN110 to SWN420 need to be applied with a high voltage compared with the thin-film transistors, the level conversion circuits LS1 to LS4 convert signal levels, thereby even if area of transistors included in the control circuit blocks SCB10 to SCB40 is reduced, a sufficient current can be obtained. Therefore, area of the control circuit blocks SCB10 to SCB40 can be reduced.

High-Speed Return from Power Shutdown

Figure 12:
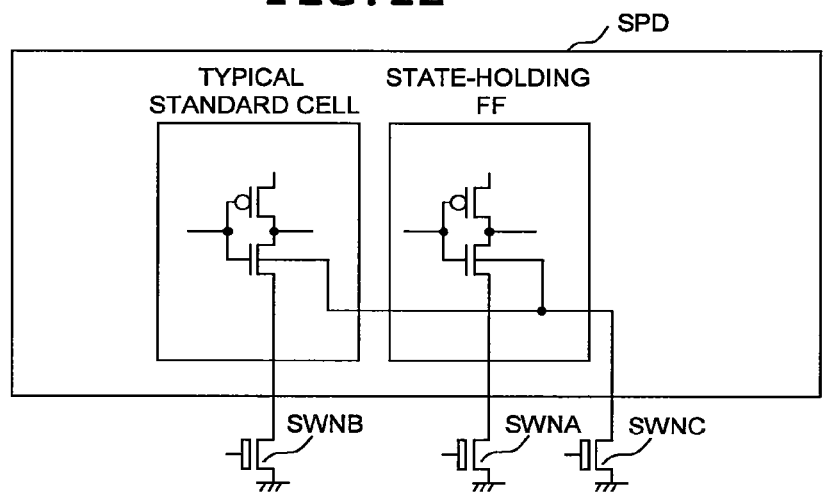
FIG. 12 is an explanatory diagram illustrating a schematic configuration of a power switch for achieving high-speed return from power shutdown.

FIG. 12 illustrates a schematic configuration of a power switch achieving high-speed return from power shutdown. Here, description is made on a case that power shutdown is performed in the second power domain SPD while data of the flip-flop FF are backed up. Hereinafter, a flip-flop FF that holds a state even during power shutdown is called state-holding FF. For the state-holding FF, power, which is different from power for a typical standard cell, is controlled by a power switch SWNA. The power for the typical standard cell is controlled by a power switch SWNB. Thus, even if the typical standard cell is subjected to power shutdown, data of the state-holding FF is held. When such a state-holding FF is integrated, substrate potential is essentially made common between the cells in the light of reduction in area. However, when a substrate of the state-holding FF is in common with a substrate of the typical standard cell, in the case that the typical standard cell is subjected to power shutdown, substrate potential of the state-holding FF is shut down at the same time. Thus, the substrate of the state-holding FF is also into a floating condition, and therefore a relationship in substrate potential is reversed to power for the state-holding FF, and consequently a forward junction current may flow.

When the substrate of the typical standard cell is separated from the substrate of the state-holding FF to avoid this, area OH is increased due to integration of the separated cells. Thus, as shown in the figure, a substrate of the typical standard cell and a substrate of the state-holding FF are made into common, so that even if the typical standard cell is subjected to power shutdown, the substrate is not subjected to power shutdown. In such a condition, increase in area OH can be suppressed. However, in this case, a large amount of junction leakage current passing through the substrate may flow in a fine processing process. Therefore, a power switch SWNC in a different system is provided also for substrate power, thereby the leakage current during standby can be reduced.

Hereinbefore, while the invention made by the inventor was specifically described according to the embodiments, the invention is not limited to those, and it will be appreciated that the invention can be variously altered or modified within a scope without departing from the gist of the invention.

Figure 13:
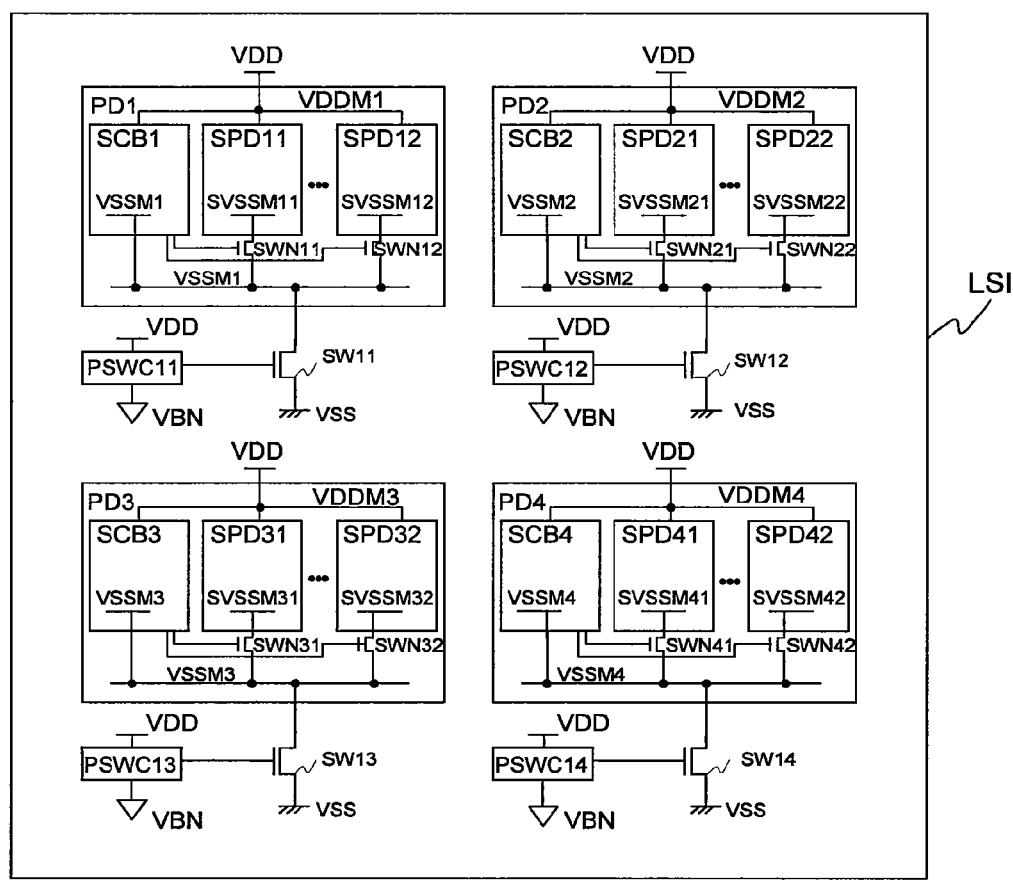
FIG. 13 is an explanatory diagram illustrating a circuit configuration of logic LSI in the case that respective power switches have the same gate insulating films.

For example, while the thick-film power switches SW1 to SW4 and SW21 to SW24 are formed by the thick-film transistors manufactured by a common process to the external input/output circuit I/O, and have different thickness of gate insulating films from the thin-film switches SWN11 to SWN42 and SWP11 to SWP42 or the power switches SWN110 to SWN420 in the embodiments 1 to 5, the invention is not limited to this. FIG. 13 shows a circuit configuration example of logic LSI in the case that respective power switches have the same gate insulating films. Here, the logic LSI includes a plurality of first power domains PD1 to PD4, power switches SW11 to SW14, and power switch controllers PSWC11 to PSWC14 therein. The first power domains PD1 to PD4 have a plurality of second power domains SPD11 to SPD42; control circuit blocks SCB1 to SCB4; and thin-film power switches SWN11 to SWN42 connected to the power switches SW11 to SW14 via the virtual ground lines VSSM1 to VSSM4 respectively. The second power domains SPD11 to SPD42 have circuit blocks connected to power lines VDDM11 to VDDM42 for receiving the power voltage VDD, and sub virtual ground lines SVSSM11 to SVSSM42 connected to the thin-film power switches SWN11 to SWN42. The power switches SW11 to SW14 are formed by thin-film power transistors in which the gate insulating films are same as those of thin-film transistors arranged in regions of the circuit blocks.

In a word, here, in the logic LSI, all the power switches have the same thickness of the gate insulating films. The power switch controllers PSWC11 to PSWC14 applies a negative gate voltage VBN lower than the ground voltage VSS to gates of the power switches SW11 to SW14. Thus, even if the power switches SW11 to SW14 are used, which include transistors in which the gate insulating films are thin and the threshold voltages are low compared with the thick-film power switches, the leakage current can be controlled to be low.

Figure 14:
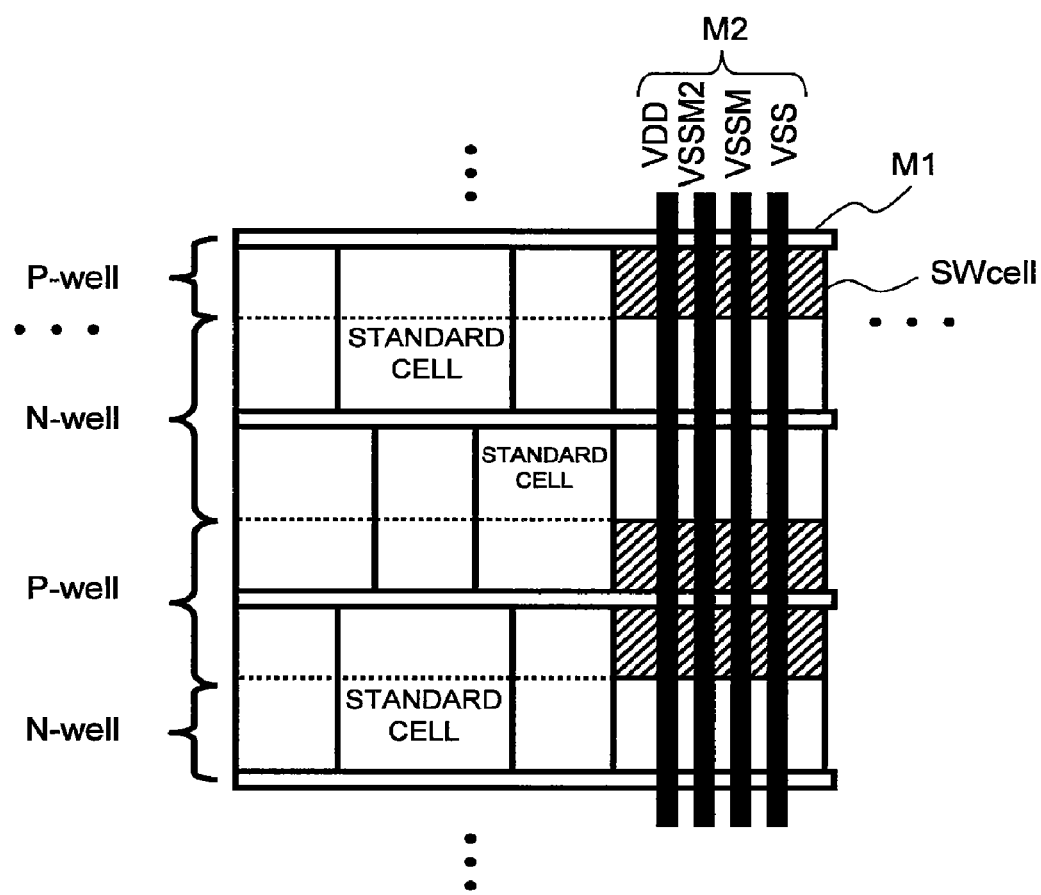
FIG. 14 is an explanatory diagram showing an example of integrating power switches, different from that in FIG. 7, and an example of wiring power lines.

While an example of integrating the thick-film power switches and the thin-film power switches in LSI was shown in FIG. 7, the invention is not limited to this. FIG. 14 shows an example of integrating power switches, different from that in FIG. 7, and an example of wiring power lines. Here, an example is shown, in which first metal lines M1 are wired in a direction where standard cells are arranged, that is, in a lateral direction in the figure, and second metal lines M2, that is, VDD, VSS, VSSM and VSSM2 in the figure are wired in a direction perpendicular to the lateral direction. Moreover, regions under the second metal lines M2 are made to be switch regions, and sub power switches, capacitance cells and the like are integrated under the switch regions. Furthermore, regions shown by oblique lines in the figure correspond to switch cells SWcell which are formed only by P-well. The LSI as described hereinbefore can be used not only for the system for mobile devices such as mobile phone, but also various microprocessors to which high-speed operation and power saving are required.

What is claimed is:

1. A semiconductor integrated circuit comprising:
    a plurality of first power switches that receive a ground voltage, and are formed by n-channel MOS transistors;
    first ground lines connected to the first power switches;
    a plurality of second power switches that receive a power voltage, and are formed by p-channel MOS transistors in which the gate insulating films are thinner than gate insulating films of the first power switches;
    first power lines connected to the plurality of second power switches respectively;
    a plurality of circuit blocks connected to the first ground lines and the first power lines respectively;
    first control circuits for controlling the first power switches individually; and
    second control circuits for controlling the second power switches individually.

2. The semiconductor integrated circuit according to claim 1, further comprising:
    third control circuits that are connected to gates of the second power switches, and perform control of allowing the second power switches to function as regulators.

3. A semiconductor integrated circuit comprising:
    a plurality of first power switches that receive a power voltage, and are formed by p-channel MOS transistors;
    a plurality of second power switches that receive a ground voltage, and are formed by n-channel MOS transistors in which the gate insulating films are thinner than gate insulating films of the first power switches;
    first ground lines connected to the plurality of second power switches respectively;
    first power lines connected to the first power switches;
    a plurality of third power switches that are connected to the first power lines, and formed by p-channel MOS transistors in which the gate insulating films have the same thickness as the gate insulting films of the second power switches;
    second power lines connected to the plurality of third power switches respectively;
    a plurality of circuit blocks connected to the first ground lines and the second power lines respectively;
    first control circuits for controlling the first power switches individually; and
    second control circuits for controlling the second power switches and the third power switches individually.

4. A semiconductor integrated circuit comprising:
    a plurality of first power switches for receiving a ground voltage;
    first ground lines connected to the first power switches;
    a plurality of second power switches connected to the first ground lines;

second ground lines connected to the plurality of second power switches respectively;

a first power lines for receiving a power voltage;

a plurality of circuit blocks connected to the second ground lines and the first power lines respectively;

first control circuits for controlling the first power switches individually; and second control circuits for controlling the second power switches individually;

wherein the first power switches and the second power switches are formed by transistors in which the gate insulating films have the same thickness as thickness of gate insulating films of transistors arranged in regions of the circuit blocks, and the first control circuits apply a voltage lower than the ground voltage to gates of the first power switches.

* * * * *